United States Patent [19]

Claassen

[11] 4,058,824
[45] Nov. 15, 1977

[54] SEMICONDUCTOR DIODE
[75] Inventor: Manfred Claassen, Braunschweig, Germany
[73] Assignee: Licentia Patent-Verwaltungs-G.m.b.H., Frankfurt am Main, Germany
[21] Appl. No.: 361,303
[22] Filed: May 16, 1973
[30] Foreign Application Priority Data
May 18, 1972 Germany .............................. 2224159
[51] Int. Cl.$^2$ ..................... H01L 29/48; H01L 29/06; H01L 23/48; H01L 29/44
[52] U.S. Cl. ........................................ 357/15; 357/55; 357/56; 357/67; 357/68; 357/90
[58] Field of Search ................... 317/235, 27.1, 31, 30; 357/15, 55, 56, 67, 68, 90

[56] References Cited
U.S. PATENT DOCUMENTS

| 3,509,428 | 4/1970 | Mankarious et al. | ................. 317/234 |
| 3,752,702 | 8/1973 | IIzuka et al. | .......................... 117/217 |

Primary Examiner—Edward J. Wojciechowicz
Attorney, Agent, or Firm—Spencer & Kaye

[57] ABSTRACT

A semiconductor diode has a blocking electrode for minority carriers constructed in such a manner that the space charge region extends right up to the blocking electrode in the operation state.

21 Claims, 7 Drawing Figures

SEMICONDUCTOR DIODE

BACKGROUND OF THE INVENTION

The invention relates to a semiconductor diode, particularly an avalanche delay diode, with a blocking electrode for minority carriers.

SUMMARY OF THE INVENTION

It is an object of the invention to provide delay diodes having low depletion layer capacitance with high thermal shunt conductance.

According to one aspect of the invention, there is provided a semiconductor diode comprising a semiconductor body, and a blocking electrode associated with said semiconductor body for minority carriers and for extending the space charge region of said diode up to said blocking electrode in the operational state.

According to a second aspect of the invention, there is provided a method of producing a semiconductor diode comprising the step of forming a blocking electrode in association with a semiconductor body, which electrode blocks the minority carriers and extends the space charge region of said diode up to said blocking electrode in the operational state.

BRIEF DESCRIPTION OF THE DRAWINGS

The invention will now be described in greater detail, by way of example, with reference to the drawings, in which

FIG. 6b is a plan view of the diode of FIG. 6a.

DESCRIPTION OF THE PREFERRED EMBODIMENTS

Figure 1:
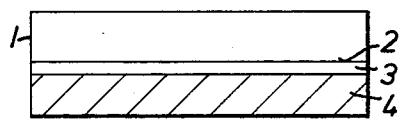
FIG. 1 is a sectional view of a first stage of the manufacture of a first form of diode in accordance with the invention.

The invention proposes, in the case of a semiconductor diode of the type mentioned at the outset, that the diode be constructed in such a manner that the space charge region in the operational state extends right up to the blocking electrode for the minority carriers. This requirement is achieved by suitable doping of the semiconductor body as well as by suitable dimensioning of the spacing between the space charge region forming junction and the blocking electrode for minority carriers.

The blocking electrode for minority carriers comprises, for example, a metal-semiconductor contact with low barrier level for the majority carriers or a semiconductor region of the type of conductivity of the semiconductor body as well as a metal layer adjacent thereto, wherein the semiconductor region is doped by the type of conductivity of the semiconductor body more strongly than the semiconductor body. Such a blocking contact for minority carriers is obtained when using a semiconductor body of silicon of the n-type of conductivity, for example by an Au-Sb alloy, in which a thin n+-region in the semiconductor body arises in front of the metal electrode. This semiconductor region is, however, generally so thin that it is substantially thinner than the rest of the semiconductor body.

A space charge region is obtained, for example, by a rectifying metal-semiconductor contact or by a pn-junction. In the case of a pn-junction one of the two semiconductor regions forming the pn-junction is contacted by an ohmic electrode, i.e. a nonrectifying electrode. Thus, according to the invention, semiconductor diodes with an ohmic electrode and a blocking electrode for minority carriers of semiconductor diodes with a blocking metal-semiconductor contact for majority carriers is obtained as an electrode and likewise a blocking electrode for minorities.

In accordance with a further development of the invention, the blocking electrode for minority carriers has a smaller cross-section than the other electrode. In accordance with another form of embodiment of the invention, the semiconductor material at the electrode edge is removed under the electrode with the smaller cross-section. Such an arrangement for construction of the semiconductor body is obtained, for example, by lateral under-etching of the electrode. For example, a photolacquer masking or the electrode with the smaller cross-section itself serves as the etching mask.

In accordance with a further form of embodiment of the invention, the semiconductor body of the semiconductor diode is mesa-etched. The mesa-etching is effected, for example, in such a manner that the cross-section of the semiconductor body increases in the direction towards the electrode with the greater cross-section. This is achieved, for example, by etching that side of the semiconductor body outwards, on which the electrode with the smaller cross-section is located. Also, in this case, a photolacquer masking or the electrode with the smaller cross-section itself can again be used as the etching mask.

In accordance with a further development of the invention, the mesa-etching is effected in that both electrodes are laterally under-etched. The mesa-structure, of course, can also be produced in other ways apart from etching.

In accordance with the invention, a semiconductor diode is produced, for example, in that on one side of a semiconductor body, a pn-junction with an ohmic electrode or a blocking electrode for majority carriers, is produced in the form of a metal-semiconductor contact or a MIS-structure or another structure producing a space charge layer. The ohmic electrode or the blocking electrode are in this case constructed in such a manner that they can take over the function of a carrier body. Finally, a semiconductor body can be removed, for example by etching, on the side opposite the electrode up to a specified thickness and the semiconductor body on the side, on which the semiconductor material was removed, is provided with a blocking contact for minority carriers (e.g. with an ohmic electrode). The semiconductor body is removed so far that in operation the space charge region of the blocking junction reaches right up to the minority carrier blocking contact.

The invention will be described in greater detail in the following with reference to exemplary embodiments.

Referring now to the drawings, the production of an avalanche delay diode according to the invention starts, for example, according to FIG. 1, from a semiconductor body 1 and a barrier layer or a pn-junction 2 are produced in this semiconductor layer on one side. This is effected, for example, by forming impurities in an outer surface of the semiconductor body 1 so that a semiconductor region 3 arises which has the opposite type of conductivity to that of the semiconductor body 1. The semiconductor body 1 comprises, for example, silicon. Its conductivity amounts to, for example, 1 to 2 Ohmcm, whereas the semiconductor region 3 produced by diffusion has a conductivity of, e.g. 0.01 Ohmcm. Finally, an ohmic electrode 4 is applied to the semiconductor body to contact the semiconductor region 3. The barrier layer 2 can, however, also be produced in that not an ohmic electrode 4 is placed on the semiconductor body 1 but a rectifying electrode 4 in the form of a rectifying metal-semiconductor contact is applied. In this case, the semiconductor region 3 of opposite type conductivity is superfluous. The electrode 4 is in both cases constructed to be sufficiently thick that it can serve as the carrier body for the semiconductor body 1. The electrode 4 can, by its initial form or by subsequent reinforcement, for example by electrolytic deposition of metal, be constructed to be sufficiently thick that it can take over a carrier function for the semiconductor body.

Figure 2:
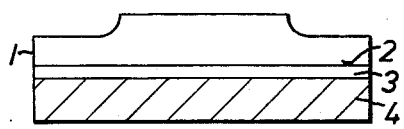
FIG. 2 is a view similar to FIG. 1 but showing a second stage of the manufacture.
Figure 3:
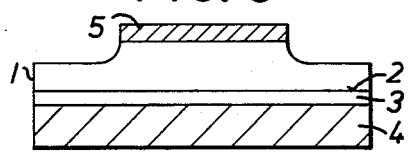
FIG. 3 is a view similar to FIG. 1 but showing a third stage of the manufacture.

After the production of the electrode 4, the semiconductor body 1 is removed, in accordance with FIG. 2, on the surface opposite the electrode 4, up to a certain thickness. The removing is effected so far that the spacing of the semiconductor upper surface from the pn-junction or the electrode producing the barrier layer, corresponds to the required space charge region width in operation (e.g. 4μm for operation in the X-band). Subsequently, as shown in FIG. 3, there is applied to the surface of the semiconductor body on which the removal took place, an ohmic electrode 5, the cross-section or area of which is smaller than that of the electrode 4. The electrode 5 in this case need not have the form of a circular surface, but can also be, for example, of annular shape for the purposes of increasing the thermal conductivity (FIG. 6).

Figure 4:
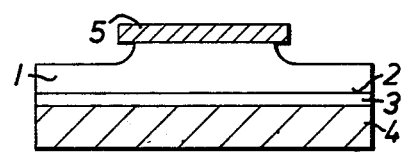
FIG. 4 is a view similar to FIG. 1 but showing a fourth stage of the manufacture.

With the production of the electrode 5, the semiconductor diode is complete per se and of itself. In accordance with a form of embodiment of the invention, the electrode 5 is, however, still laterally under-etched in conformity with FIG. 4. Such under-etching has the advantage that any possible edge disruptive discharges by field concentration at the electrode edges are avoided.

Figure 5:
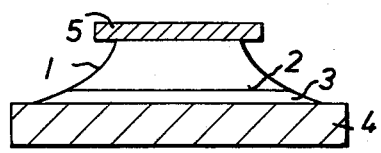
FIG. 5 is a view similar to FIG. 1 but showing a fifth stage of the manufacture.

In the case of the form of embodiment of FIG. 5 additionally a further step has been taken, that is to say the electrode there is not only laterally under-etched, but a regular mesa-etching is undertaken which includes the entire semiconductor body 1 and extends from the electrode 5 right up to the opposite electrode 4. The cross-section of the semiconductor body 1 in this case increases in the direction of the electrode 4. The mesa-etching is effected from the electrode 5, wherein this electrode can also be used even as an etching mask in the case of suitable selection of the electrode material. A mesa-etching has the advantage that, as above, edge disruptive discharges are avoided and in that the diodes produced individually and simultaneously on one wafer are separated.

The mesa-etching of FIG. 5 is so carried out that both electrodes are laterally under-etched.

Figure 6A:
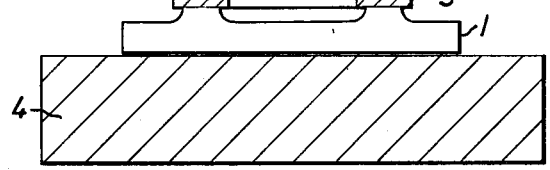
FIG. 6a is a sectional view of a second form of diode in accordance with the invention.
Figure 6B:
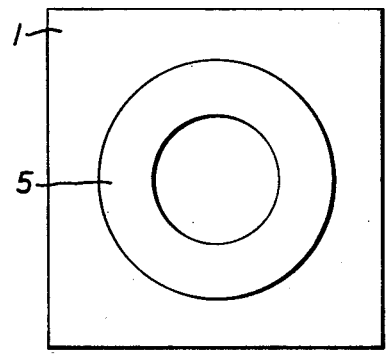

Finally, FIG. 6 shows a further exemplary embodiment of the invention in which the ohmic electrode 5, which is on that side on which the mesa-etching is undertaken, is made annular. FIG. 6a shows such a semiconductor arrangement in cross-section, whereas FIG. 6b shows the semiconductor arrangement in plan view.

It will be understood that the above description of the present invention is susceptible to various modification changes and adaptations.

What is claimed is:

1. In a semiconductor delay diode comprising a semiconductor body of a first conductivity type, means, adjacent one surface of said body and including a rectifying junction, for providing a space charge region in said body, and a blocking electrode for minority carriers adjacent the opposite surface of said semiconductor body, the improvement wherein the doping of said semiconductor body and the spacing between said blocking electrode and said junction are such as to extend the space charge region of said diode up to said blocking electrode in the operational state.

2. A semiconductor diode as defined in claim 1, wherein said blocking electrode comprises an ohmic metal-semiconductor contacts, with a high barrier level for the said minority carriers, on said opposite surface.

3. A semiconductor diode as defined in claim 1, wherein said blocking electrode comprises: a semiconductor region in said semiconductor body adjacent said opposite surface, said region being of the same conductivity type as said semiconductor body and being more highly doped than said semiconductor body, and a metal layer ohmically contacting said semiconductor region.

4. A semiconductor diode as defined in claim 3, wherein said semiconductor region has a thickness substantially less than the thickness of the remainder of said semiconductor body.

5. A semiconductor diode as defined in claim 1, wherein said rectifying junction of said space charge region providing means comprises a rectifying metal-semiconductor contact.

6. A semiconductor diode as defined in claim 1, wherein said rectifying junction of said space charge providing means comprises a pn-junction.

7. A semiconductor diode as defined in claim 6 wherein said pn-junction is formed between said semiconductor body and a semiconductor region of opposite conductivity type provided within said body adjacent said one surface and further comprising an ohmic contact to said semiconductor region forming said pn-junction.

8. A semiconductor diode as defined in claim 1, wherein said semiconductor body comprises silicon of n-type conductivity and said blocking electrode comprises an Au-Sb contact.

9. A semiconductor diode as defined in claim 1, further comprising a second electrode, of larger cross-section than said blocking electrode, on said one surface.

10. A semiconductor diode as defined in claim 9, wherein said blocking electrode has a larger surface facing said semiconductor body than the surface of said semiconductor body in contact with said blocking electrode.

11. A semiconductor diode as defined in claim 9, wherein said blocking electrode is laterally underetched.

12. A semiconductor diode as defined in claim 11, wherein said semiconductor body has a mesa-etched form with a cross-section which decreases in the direction toward said blocking electrode.

13. A semiconductor diode as defined in claim 9, wherein both of said electrodes are underetched.

14. A semiconductor diode as defined in claim 9, wherein the one of said two electrodes limiting the space charge region of said semiconductor diode comprises an annular electrode.

15. A method of producing a semiconductor delay diode comprising the steps of: forming a rectifying junction in a semiconductor body of one conductivity type adjacent one surface thereof; forming a blocking electrode for minority carriers adjacent the opposite surface of said semiconductor body; and, adjusting the thickness of said semiconductor body so that the spacing between said rectifying junction and said blocking electrode for minority carriers is such that the space charge region of said diode extends up to said blocking electrode in the operational state.

16. A method as defined in claim 15, and further comprising the step of forming a second electrode on said one surface of said semiconductor body so as to provide a carrier body for said semiconductor diode.

17. A method as defined in claim 16 wherein: said step of forming a rectifying junction includes providing a region of the opposite conductivity type within said semiconductor body adjacent said one surface to form a pn-junction; and said step of forming a second electrode includes forming said second electrode as an ohmic electrode contacting said region.

18. A method as defined in claim 16 wherein said step of forming a rectifying junction includes providing said second electrode in the form of a rectifying metal-semiconductor contact on said one surface of said semiconductor body.

19. A method as defined in claim 16 wherein said step of adjusting comprises: after said step of forming a rectifying junction, removing the semiconductor body material up to a predetermined thickness from the surface of said semiconductor body opposite to said second electrode and thereafter forming said blocking electrode for said minority carriers thereon.

20. A method as defined in claim 19, and further comprising mesa-etching said semiconductor body on the surface thereof said blocking electrode for said minority carriers.

21. A method as defined in claim 20, and comprising mesa-etching said semiconductor body from one said electrode to the other said electrode.

* * * * *